United States Patent [19]

Takabayashi

[11] Patent Number: 5,056,844
[45] Date of Patent: Oct. 15, 1991

[54] MULTIPLE JAW CENTERING HEAD STRUCTURE FOR SURFACE MOUNTED COMPONENT PLACEMENT MACHINES

[75] Inventor: Susumu Takabayashi, Oceanside, Calif.

[73] Assignee: Amistar Corporation, San Marcos, Calif.

[21] Appl. No.: 489,908

[22] Filed: Mar. 6, 1990

[51] Int. Cl.⁵ ................. B23P 19/04; H05K 13/04
[52] U.S. Cl. ........................... 294/106; 294/2; 29/741; 29/845
[58] Field of Search ............ 294/106, 2, 902; 29/739, 740, 741, 743, 759, 842, 845

[56] References Cited

U.S. PATENT DOCUMENTS

| | | | |
|---|---|---|---|
| 4,286,380 | 9/1981 | Blount | 29/741 |
| 4,473,247 | 9/1984 | Itemadani et al. | 294/2 |
| 4,559,853 | 12/1985 | Oye | 294/902 X |
| 4,583,287 | 4/1986 | McDevitt et al. | 29/741 |
| 4,599,037 | 7/1986 | Ross, Jr. et al. | 294/2 X |
| 4,628,594 | 12/1986 | Yamagami et al. | 29/741 |
| 4,645,407 | 2/1987 | Williams | 901/31 X |
| 4,858,974 | 8/1989 | Stanneck | 294/2 |

FOREIGN PATENT DOCUMENTS

| | | | |
|---|---|---|---|
| 1306886 | 4/1987 | U.S.S.R. | 294/902 |
| 1364592 | 1/1988 | U.S.S.R. | 294/2 |

Primary Examiner—Margaret A. Focarino
Assistant Examiner—Dean J. Kramer
Attorney, Agent, or Firm—John Holtrichter, Jr.

[57] ABSTRACT

There is herein described an improved surface mounted component placement mechanism head structure which automatically accepts a very wide size range of such components.

5 Claims, 4 Drawing Sheets

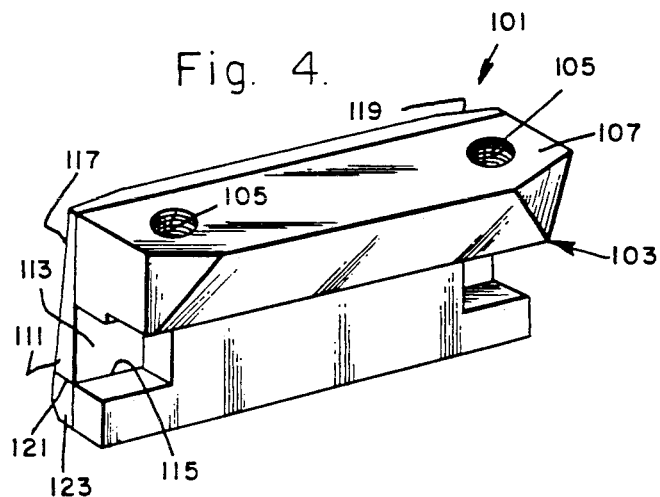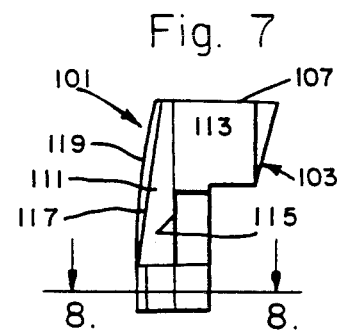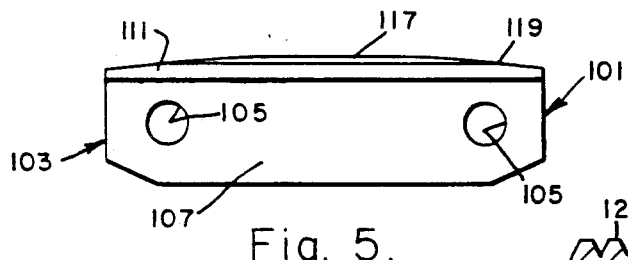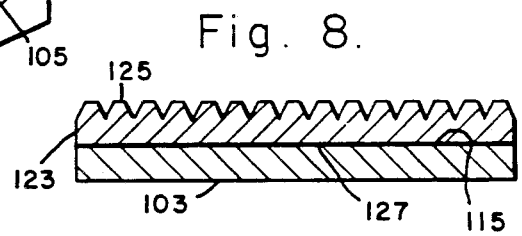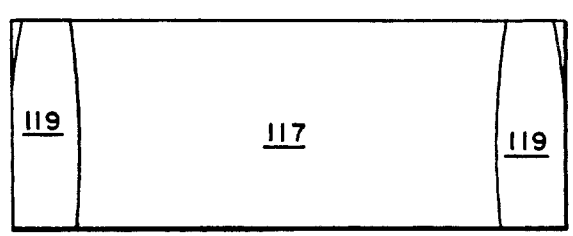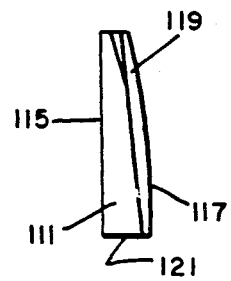

MULTIPLE JAW CENTERING HEAD STRUCTURE FOR SURFACE MOUNTED COMPONENT PLACEMENT MACHINES

TECHNICAL FIELD

This invention relates to the electronics manufacturing industry and more particularly to apparatus for mounting electronic surface mounted components (SMC). These components have connection pads instead of elongated leads, and the SMC are mounted onto printed circuit boards, which are board-like panels that are formed on suitable dielectric material and have electrical circuits printed on or otherwise applied to the surface thereof. The printed circuits include connection pads for registration with and electrical connection to corresponding connection pads of the SMC.

BACKGROUND ART

The mounting of discrete electrical components onto printed circuit boards by automated means is well known. For a rather extended period of time, the electrical components, such as resistors, capacitors, inductors, and the like, included axial leads. Over the years, several types of apparatus had been developed to automate this procedure and thereby increase production. Basically, these machines bend the leads, align the components and their leads with respect to lead holes in the printed circuit board to be populated, and then insert the leads into the appropriate holes. The leads are then bent over or clinched to retain the components on the board prior to a soldering operation which both mechanically and electrically bonds the component to the board. In more recent times, however, a new electrical component packaging technique has been developed which does not require through-hole insertion. These are known as surface mounted components or SMC.

Surface mounted components lack or eliminate the long leads associated with through-hole mounted components. SMC's are finding wide use in the electronic industry, and like their leaded counterparts, require accurate placement on printed circuit boards, or other substrate media, prior to soldering. Accordingly, automatic machines have been developed to accomplish this task.

In an early SMC-delivering machine, the components are fed via tubes and apertures and are positioned on a slidable plate, situated over a printed circuit board, in a position which corresponds to the desired position of the components on the board. Subsequently, the plate is displaced while the components are retained so that the components ultimately drop onto the substrate. Due to the uncontrolled dropping motion, there is a risk that the components will tilt, rotate, or land in an incorrect position on the board.

In U.S. Pat. No. 4,393,579, a device for mounting chip-type electronic components on a substrate is disclosed which is designed to enable accurate positioning and mounting of chip-type components such as SMC in a controlled and reproducible manner. This device includes a slide having a recess for accommodating and transporting a component. The component is linearly displaceable in a guide between a loading position and an unloading position, and a suction device which is displaceable in the vertical direction serves to pick up a component from the slide when the latter is in the unloading position, and then move the component downward through a passage in the guide to position the picked-up component onto the substrate positioned underneath the guide. Although this is an improvement over the previously known art, it still leaves much to be desired in speed of operation and reliability.

Also according to the prior art, as exemplified by U.S. Pat. No. 4,381,601, there is disclosed a method for mounting electronic components such as semiconductor pellets or chips to the tip end of an attraction nozzle, holding, and automatically orienting the sucked electronic component by means of a plurality of arms arranged along the outer periphery of the tip end of the sucking nozzle, transferring the held electronic component to a predetermined bonding position on a semiconductor device substrate, and opening the arms to bring down the electronic component onto the predetermined bonding position for bonding. Although this apparatus is adequate for the task of picking up and depositing a component, it does not include a, reliable and accurate means for transporting the component from an input station to a desired location and in exact registration with connection pads on a printed circuit board. In U.S. Pat. Nos. 4,135,630 and 4,290,732 machines are described for picking up electrical components and placing them at desired positions and orientations on a substrate. The pick-up heads of these machines utilize a vacuum or suction tool by which components are held on the head and pawls or fingers are used to position the components on the tools. These devices work well with electrical components of a particular size and shape, but such components are not all similar in dimension. At best these machines can handle a small range of sizes of components. However, it is frequently necessary to position a number of components of widely varying sizes and shapes on a single substrate, and the above-noted prior art devices cannot provide sufficient accuracy and reliability with a single pick-up head without manually adjusting or changing the pawls or fingers, which would be very inconvenient and time-consuming. This problem has been solved in the past by providing a plurality of pick-up heads, each adapted to pick up a different size range of components.

More recently, a head for handling various sizes of electrical components has been described in U.S. Pat. No. 4,624,050. This device includes a head for handling electrical components, the head including a plurality of orienting jaws mounted for movement toward and away from a component carried on a datum face of a tool on a tool holder when the holder is in one of the datum positions. A key feature of this device is that the jaws have a plurality of spaced sets of cooperating datum faces disposed generally transversely to the plane of the datum face of the tool in the holder. Each set of datum faces are disposed so as to be capable of orienting a component carried by a tool mounted on the tool holder when the holder is at a corresponding one of the datum positions. This allows for the handling of a wider variety of component sizes, but still cannot accurately accommodate an infinite variety of component sizes as may be required in the industry.

It should thus be clear that the prior art in the subject area of interest generally lacks the versatility reliability and accuracy required to handle an infinite variety of component sizes of SMC's that is needed in the industry, and that a centering head jaw structure for SMC placement mechanisms which obviates the aforementioned shortcomings would constitute a significant advancement in the art.

SUMMARY OF THE INVENTION

In view of the foregoing factors and conditions characteristic of the prior art, it is a primary object of the present invention to provide a new and improved multiple jaw centering head jaw structure for surface mounted component placement machines.

Another object of the present invention is to provide a simple yet reliable and very accurate placement head as part of a surface mounted component transporting and mounting system.

Still another object of the present invention is to provide a SMC transporting and mounting head and jaw structure which eliminates the problems associated with prior art mechanisms.

Yet another object of the present invention is to provide a multiple jaw centering head for surface mounted component placement machines utilizing at least a pair jaws adapted to precisely engage the outer edges of the SMC to be mounted.

In accordance with an embodiment of the present invention, a multiple jaw centering head for surface mounted component placement machines includes at least one pair of elongated, pivotally supported, opposed jaw arms, the lower extremities of which being movable toward and away from a component to be mounted on a circuit board; and actuating means coupled to the jaw arms for causing relative movement therebetween. Also, the invention includes a component-engaging jaw structure attached to the lower extremity of each of the arms, the jaw structures each having mirror image matching smooth vertically curved inner surfaces adapted to precisely engage opposite outer edges of the component to be mounted.

The smooth curved inner surfaces may be inclined, and the distance between the component engaging inner surfaces of the opposed jaw structures may be greater at the top of the jaw structure than at the bottom thereof. Also, the distance between the component-engaging inner surfaces of the opposed jaw structures may gradually and continuously decrease in a downward direction from the top of the jaw structures.

The features of the present invention which are believed to be novel are set forth with particularity in the appended claims. The present invention, both as to its organization and manner of operation and use, together with further objects and advantages thereof, may best be understood by making reference to the following description taken in conjunction with the accompanying drawings in which like reference characters refer to like elements in the several views.

BRIEF DESCRIPTION OF THE DRAWINGS

FIG. 4 is a perspective view of the jaw assembly in accordance with the invention;

FIG. 5 is a top view of the jaw assembly of FIG. 4;

FIG. 6 is a front elevational view of a jaw constructed in accordance with the present invention;

FIG. 7 is a side elevational view of the left side of the jaw assembly of FIG. 4;

FIG. 8 is a bottom plan view of the jaw assembly shown in FIG. 4;

FIG. 9 is a side elevational view of the right side of the jaw segment of the jaw assembly of FIG. 4;

DESCRIPTION OF THE PREFERRED EMBODIMENTS

Figure 1:
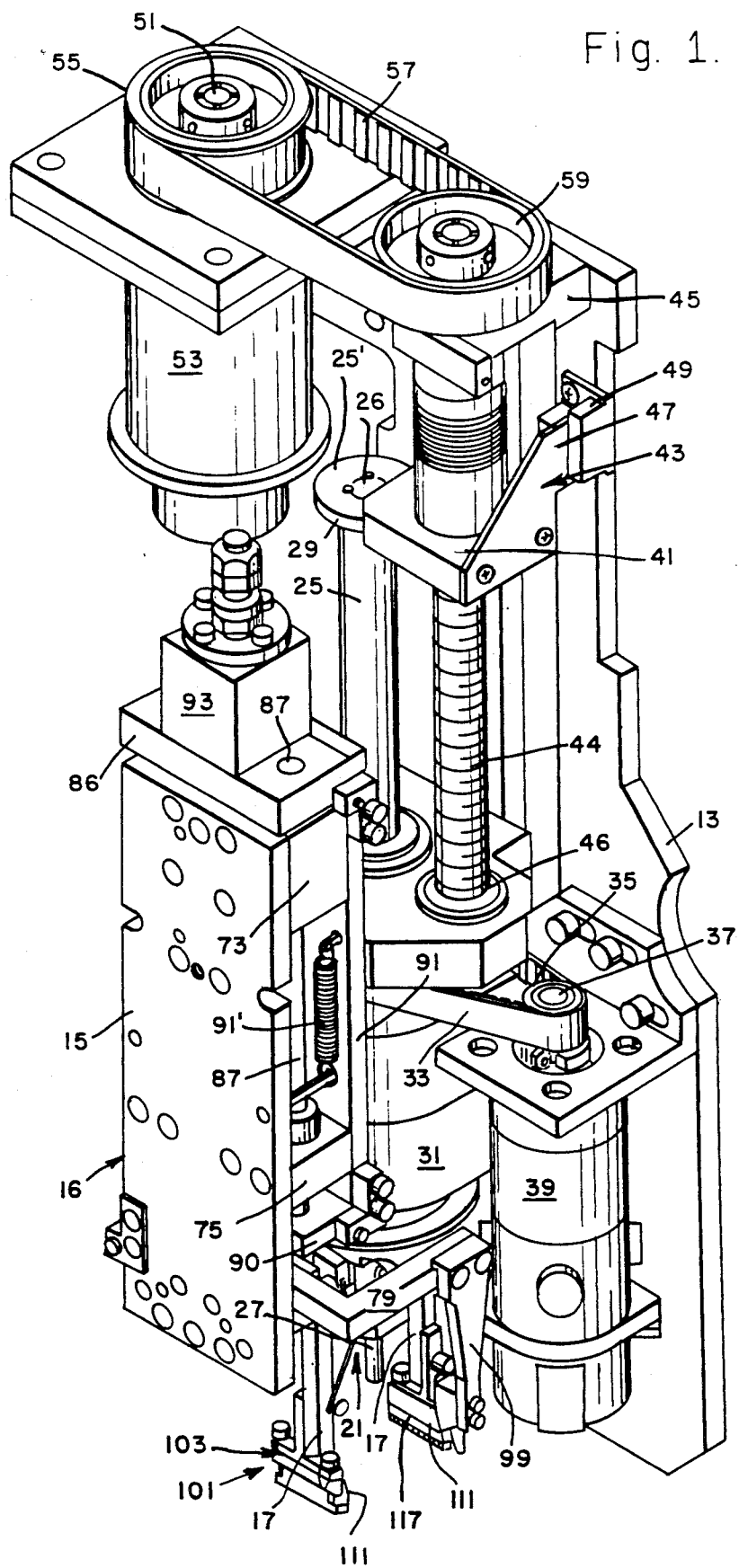
FIG. 1 is a perspective view of a multiple jaw centering head for surface mounted component placement machines incorporating the component-engaging jaw structures in accordance with an embodiment of the present invention.
Figure 2:
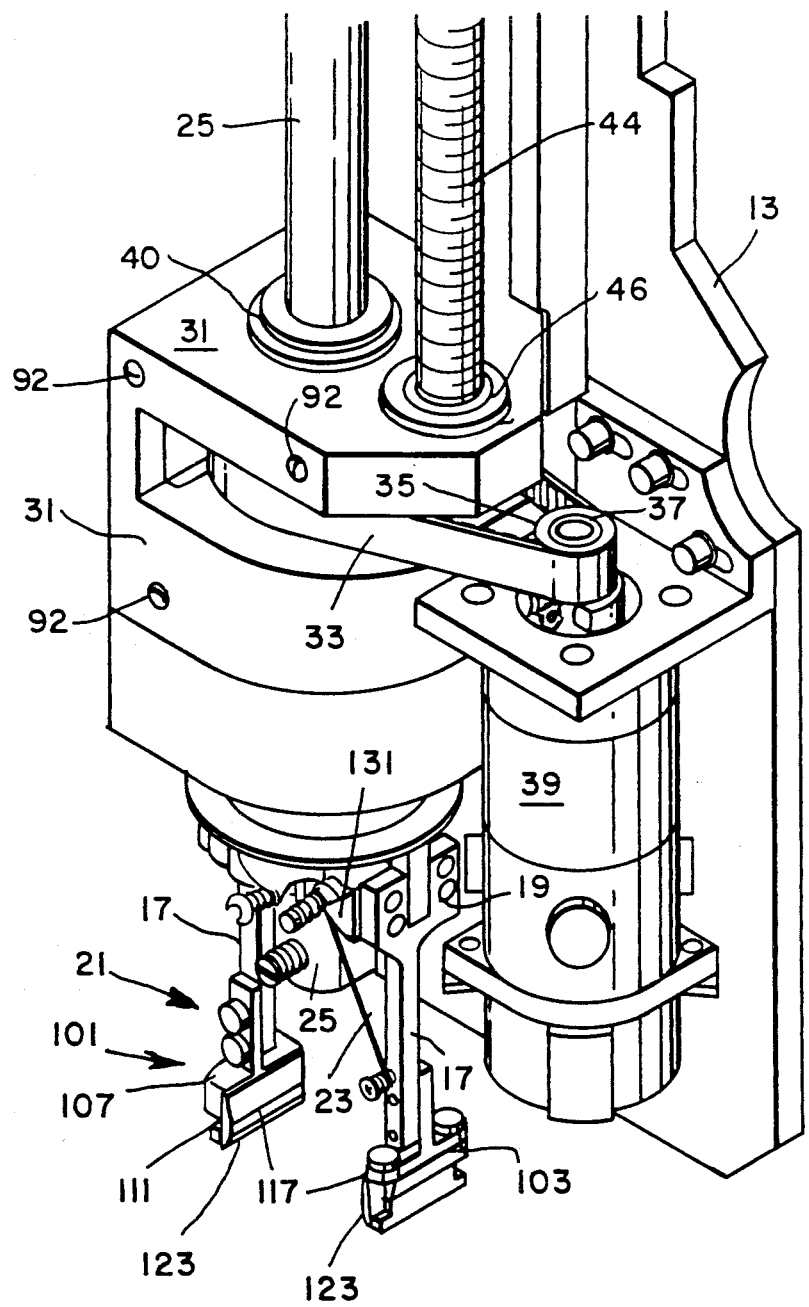
FIG. 2 is perspective view of the primary jaw portion of the multiple jaw centering head of FIG. 1.
Figure 3:
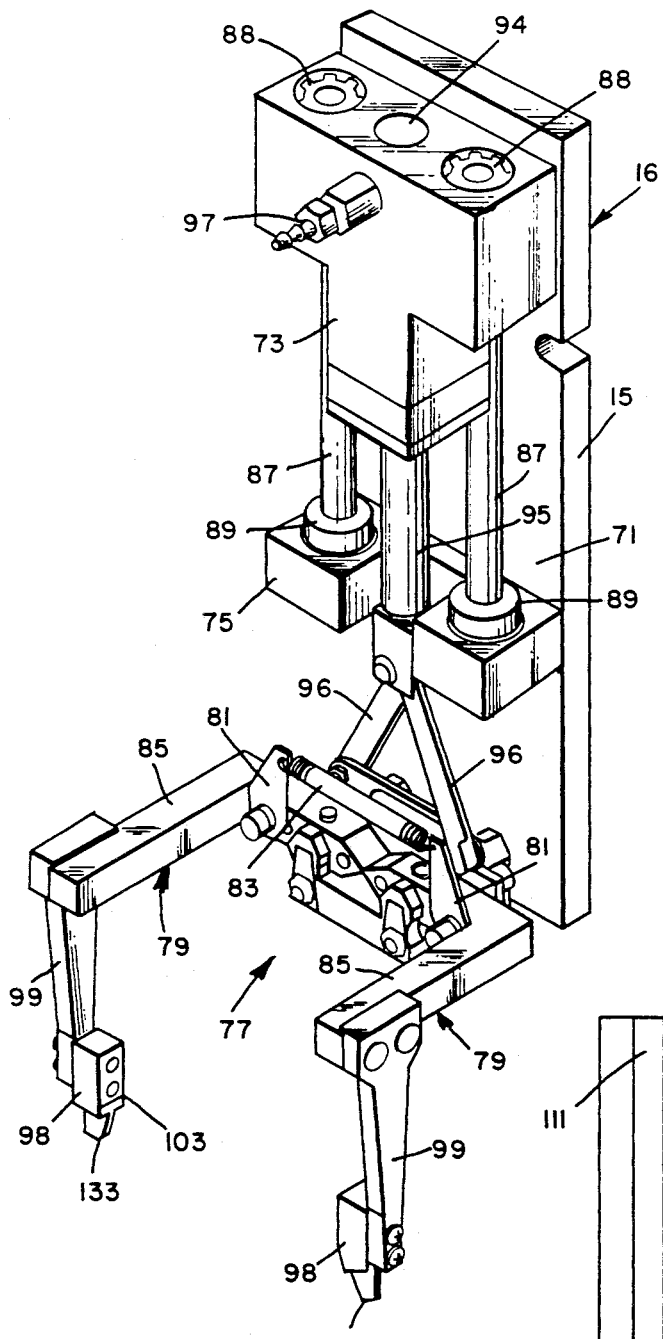
FIG. 3 is a perspective view of the secondary, centering jaw assembly shown in FIG. 1.

Referring now to the drawings and more particularly to FIGS. 1, 2 and 3, there is shown a multiple jaw centering head 11 for surface mounted component placement machines. In FIG. 1, a back plate 13 supports a z-axis movement assembly and a primary jaw rotation movement assembly, while a vertically movable plate 15, generally parallel to and spaced from the plate 13, supports a centering jaw assembly 16.

The primary jaw rotation assembly includes a pair of primary jaw arms 17 pivotally attached at their upper extremities 19 to a conventional primary jaw actuation assembly 21. A spring 23 is provided to produce a normally open jaw bias force which may be overcome to close on an SMC when the actuation assembly is activated.

Slidably disposed along an axis midway between the primary jaw arms 17 is a main spindle tube 25 having an axial bore 26, a lower stylus suction end 27 and an upper end 29 whereat the bore 26 is coupled to a conventional vacuum source through a flexible hose, not shown.

The primary jaw assembly 21 is rotatably mounted below a rotator mount 31 attached to the back plate 13, and this assembly is rotatable at least plus and minus 180 degrees by a timing belt 33 disposed about a rotator pulley 35 that is mounted on a shaft 37 of a conventional servo motor 39.

As best seen in FIGS. 1 and 2, the main spindle 25 is movable axially, through an appropriate bore and bearing 40 in the mount 31. This vertical movement is facilitated by the provision of a disk 25', fixedly mounted at the upper end 29 of the spindle 25, that engages an appropriate horizontal slot (not shown) in the inner face of a nut mount plate 41 of a vertically movable spindle mount assembly 43. Up and down movement of the assembly 43 will thus cause an associated vertical movement of the main spindle 25.

The spindle nut mount plate 41 of the spindle mount assembly 43 includes a threaded nut (not shown) that is coaxial with an elongated drive screw 44 and engages the threads thereon. Thus, rotation of the drive screw 44 will cause the vertical movement of the spindle mount assembly 43. The elongated drive screw 44 is rotatably supported adjacent its upper extremity by a bearing (not shown) in an upper support bracket 45 anchored to the plate 13, and adjacent its lower extremity by a lower bearing 46 disposed on the upper surface of the rotator mount 31. Rotation of the screw 44 causes the spindle mount assembly 43 to move vertically in a direction dependent on the direction of drive screw rotation.

The spindle mount assembly 43 also includes a side guide plate 47, the inner edge of which, rides between parallel guides 49, for example, that are mounted on the front face of the back plate 13. The function of this arrangement is to prevent rotation of the assembly 43 while allowing vertical movement thereof.

As can be best seen in FIG. 1, the drive screw 44 is rotated by the action of the rotation of a drive shaft 51 of a conventional z-axis servo motor 53 that is coupled by a drive pulley 55, a z-axis timing belt 57, and a z-axis lead-screw or drive pulley 59 attached to the upper end of the screw 44.

The secondary, centering jaw assembly 16, mounted on the plate 15, is best viewed in the perspective view of FIG. 3. Here, shown mounted on the inner face 71, is an upper cylinder-bearing housing 73, a lower bearing housing 75, and a pivoting centering arm arrangement 77. This arrangement includes a pair of mirror image swing arms 79 pivotally mounted on pins (not shown) which extend from the plate 15. The swing arms each have a spring bracket 81 between which is disposed coil spring 83 that provides a bias force tending to spread apart the lower portions 85 of the swing arms 79.

Extending downward through the bearing housing 73 from a cylinder mount bracket 86 (FIG. 1), are two spaced parallel guide rods 87 on which cylinder-bearing housing bearings 88 and bearing housing bearings 89 slide. The upper and lower ends of the rods 87 are, respectively, fixedly anchored in the cylinder mount bracket 86 and a shaft support member 90, both the cylinder mount 86 and the member 90 being attached by conventional means to a fixed plate 91 shown in FIG. 1. The fixed plate 91, in turn, is mounted to the rotator mount 31 by screws (not shown) threaded into holes 92 in mount 31 (FIG. 2).

By actuating a dual position air cylinder 93 that is disposed on the cylinder mount bracket 86, the complete centering jaw assembly 16 is moved from an upper position to a lower vertical position through the action of a piston rod (not shown) coupled to and extending below the cylinder 93 and abutting, at its lower end, a rubber bumper member 94 at the top of the housing 73, and against the bias force of a coil spring 91' anchored at its upper end to plate 91 and at its lower end to plate 15.

Coupled to a conventional two-position spring-return air cylinder mounted in the cylinder-bearing housing 73 is a downward extending elongated shaft 95 that is axially movable by the two-position air cylinder. The lower end of the shaft 95 is coupled through a pair of links 96 which are, in turn, pivotally connected to the pivot brackets 79. Thus, when the air cylinder in the housing 73 is actuated by supplying pressurized air to an air fitting 97, the swing arms 85 are moved toward each other against the bias force of the spring 83. Also moving toward each other are a pair of centering jaws 98 mounted, respectively, at the lower portions of associated centering legs 99 extending downward from the outer ends of the swing arms 79.

Referring now to FIG. 2 and FIGS. 4 through 9, there is shown a primary jaw assembly 101 constructed in accordance with the present invention. Each of the lower extremities of the primary jaw arms 17 are bolted or otherwise attached to a jaw plate 103 having threaded holes 105 in an upper planar surface 107. The primary jaw assembly 101 also includes a primary jaw member 111 having a rear planar surface 113 bonded or otherwise conventionally attached to a front planar face 115 of each of the jaw plates 103, while each member is provided with a unique mirror image component-engaging face 117. The face 117 is a smooth, vertically curved broad surface adapted to engage opposite outer edges of components having a very broad range of dimensions that are to be mounted on a circuit board. Each jaw member 111 may also be provided with beveled front side edges 119.

Attached at a lower edge 121 of the jaw member 111 is a component lead-engaging member 123 having a serrated front face 125 and planar rear face 127 attached by any conventional means, such as bonding, to the lower portion of the jaw plate's front face 115.

The serrated front face 125 is specifically designed to position and center what are known in the art as SOIC and SOLIC chip components directly on (gull wing) leads of these components, thus increasing the accuracy of locating the leads with respect to the components' respective soldering pads located on a printed circuit board.

In operation, the multiple jaw centering and gripping head, above described, is either moved over a component to be mounted or the component is moved under the head. The vacuum stylus end 27 of the main spindle 25 is lowered by activating the z-axis servo motor 53, as noted previously, to pick up and initially hold the component. The spindle is then moved upward by reversing the direction of rotation of the motor 53. Here, reversing the direction of rotation causes the spindle mount assembly 43 to move upward and thereby pull the spindle disk 25' upward which is captured in the slot in the spindle nut mount plate 41.

In moving the spindle downward, a cam (not shown) mounted on the spindle moves against cam followers 131 mounted on the inside of the arms 17 to force the arms apart against the bias force of the spring 23. Alternately, by moving the spindle to its "up" position, the cam followers 131 allow the arms to move toward each other under the bias force of the aforementioned spring. Alternately, the cam/cam follower arrangement can be designed to provide for the jaws to be moved toward each other by direct action of the cam. At the same time that the spindle moves upward, the vacuum force at the lower end of the spindle stylus 27 brings the component to be mounted to a position so that the component registers with the closing jaws of the primary jaw assembly 101.

At this point, the air solenoid in the housing 73 may be activated to cause the curved centering jaws 98 of the centering legs 99 to move toward each other and force the component into axial alignment with the longitudinal axis of the spindle 25.

Once the component is so held, the centering jaws are withdrawn by removing air pressure at the air fitting 97 to allow the primary jaws to be rotated, if necessary, to orient the component for proper alignment with the lead contacts on the PCB.

Figure 10:
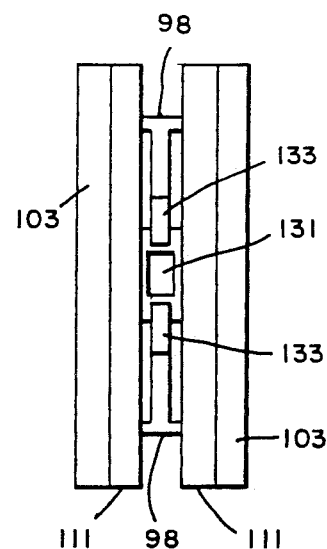
FIG. 10 is bottom view of multiple jaws of the invention gripping a relatively small electronic component.
Figure 11:
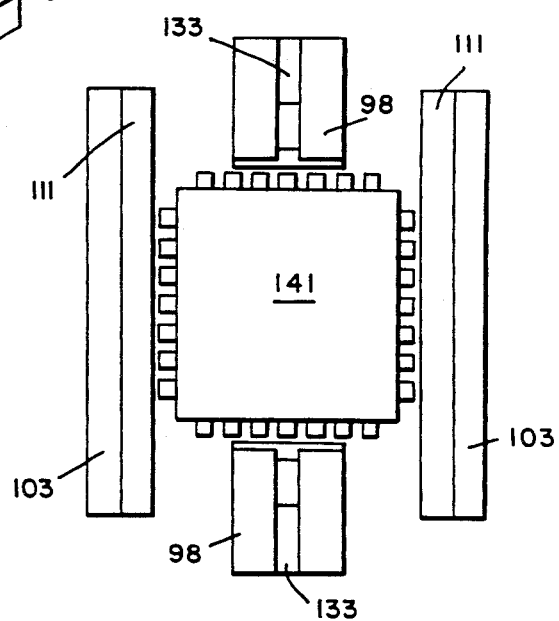
FIG. 11 is similar to FIG. 10 showing the gripping of a relatively larger electronic component.

In the case of a relatively small dimensioned component 131, the air cylinder 93 is not actuated, and FIG. 10 shows how relatively thin blades 133 of the centering jaws 98 engage opposite sides of the component and allow the primary jaws 111 to grip the component without interference. Alternately, in the case of a relatively large component 141, the centering jaws may either not be utilized or the assembly 16 may be lowered by actuation of the cylinder 93 to allow the broad surface of the centering jaws 98 to engage and center the component and, in any case, cannot interfere with the operation of the primary jaws 111, as shown in FIG. 11.

From the foregoing it should be evident that there has herein been described a new and improved multiple jaw centering head jaw structure used in the population of leadless mounted components in printed circuit board fabrication. It can be seen that the invention provides a simple yet reliable surface mounted component placement head that is very accurate and may be part of a surface mounted component transport and mounting system, and which eliminates the problems associated with prior art placement heads. Also, it has been shown that the present invention may, because of its unique configuration, accept a very wide size range of SMC without reconfiguration.

Although the invention has been described in detail with respect to presently preferred embodiments of the invention, it should be understood that the invention may be practiced using similar functioning but different elements, under the scope of the appended claims.

What is claimed is:

1. A multiple jaw centering head for surface mounted component placement machines, comprising:
   at least one pair of elongated, pivotally supported, opposed primary jaw arms, the lower extremities of which being movable toward and away from a component to be mounted on a circuit board;
   actuating means coupled to said jaw arms for causing relative movement therebetween;
   a component-engaging jaw structure attached to the lower extremity of each of said primary jaw arms, said jaw structures each having mirror image matching smooth vertically curved inner surfaces adapted to engage opposite outer edges of the component to be mounted; and
   also comprising a centering jaw assembly including a pair of opposing centering jaw members with matching upper and lower sections, said centering jaw assembly having upper and lower vertical positions, said centering jaw members each include a centering jaw having a broad surface upper portion and a relatively narrow lower portion, said upper portion registering with a component to be mounted when said centering jaw assembly is in said lower vertical position, and said lower portion registering with a component to be mounted when said centering jaw assembly is in said upper vertical position.

2. The multiple jaw centering head according to claim 1, wherein said smooth curved inner surfaces are convex and inclined.

3. The multiple jaw centering head according to claim 2, wherein the distance between the component engaging inner surfaces of said opposed jaw structures is greater at the top of said jaw structure than at the bottom thereof.

4. The multiple jaw centering head according to claim 2, wherein the distance between the component-engaging inner surfaces of said opposed jaw structures gradually and continuously decreases from the top of said jaw structure to the bottom thereof.

5. The multiple jaw centering head according to claim 2, wherein said component-engaging jaw structures also includes a lead-engaging lower portion having a serrated front face.

* * * * *